(12) United States Patent
Chen et al.

(10) Patent No.: US 12,389,673 B2
(45) Date of Patent: *Aug. 12, 2025

(54) SEMICONDUCTOR STRUCTURE AND METHOD OF FORMING SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Jian Chen, Shanghai (CN); Shiliang Ji, Shanghai (CN); Haiyang Zhang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/397,251

(22) Filed: Dec. 27, 2023

(65) Prior Publication Data
US 2024/0128265 A1   Apr. 18, 2024

Related U.S. Application Data

(63) Continuation of application No. 17/379,487, filed on Jul. 19, 2021, now Pat. No. 11,881,480.

(30) Foreign Application Priority Data

Jul. 24, 2020   (CN) .......................... 202010724367.3

(51) Int. Cl.
*H10D 84/85*  (2025.01)
*H10D 84/01*  (2025.01)
*H10D 84/83*  (2025.01)

(52) U.S. Cl.
CPC ....... *H10D 84/852* (2025.01); *H10D 84/0142* (2025.01); *H10D 84/0179* (2025.01); *H10D 84/833* (2025.01)

(58) Field of Classification Search
CPC .... H10D 84/852; H10D 84/833; H10D 84/83; H10D 84/834; H10D 84/85; H10D 84/853; H10D 84/0142; H10D 84/0179
See application file for complete search history.

(56) References Cited

U.S. PATENT DOCUMENTS 11,881,480 B2 *   1/2024   Chen ..................... H10D 84/83

OTHER PUBLICATIONS

A. Veloso et al., "Nanosheet FETs and their Potential for Enabling Continued Moore's Law Scaling," 2021 5th IEEE Electron Devices Technology & Manufacturing Conference (EDTM). Date Added to IEEE Xplore: May 12, 2021. (Year: 2021).

* cited by examiner

*Primary Examiner* — Peter M Albrecht
(74) *Attorney, Agent, or Firm* — Anova Law Group, PLLC

(57) ABSTRACT

Semiconductor structure and method of forming semiconductor structure are provided. The semiconductor structure includes a substrate, a first isolation structure, and a first nanostructure and a second nanostructure on two sides of the first isolation structure. The semiconductor structure also includes a second isolation structure, and a third nanostructure and a fourth nanostructure on two sides of the second isolation structure. A top of the second isolation structure is lower than a top of the first isolation structure. The semiconductor structure also includes a first gate structure and a (Continued)

second gate structure. The first gate structure and the second gate structure expose a top surface of the first isolation structure. The semiconductor structure also includes a third gate structure and a fourth gate structure. The third gate structure and the fourth gate structure are in contact with each other on a top surface of the second isolation structure.

20 Claims, 6 Drawing Sheets

SEMICONDUCTOR STRUCTURE AND METHOD OF FORMING SEMICONDUCTOR STRUCTURE

CROSS-REFERENCE TO RELATED APPLICATION

This application is a continuation of U.S. patent application Ser. No. 17/379,487, filed on Jul. 19, 2021, which claims priority of Chinese Patent Application No. 202010724367.3, filed on Jul. 24, 2020, the entire contents of both of which are hereby incorporated by reference.

FIELD OF THE DISCLOSURE

The present disclosure generally relates to the field of semiconductor manufacturing and, more particularly, relates to a semiconductor structure and a method of forming a semiconductor structure.

BACKGROUND

Nowadays, a fin field effect transistor (FinFET) architecture is a mainstream in semiconductor industry. However, as a device continuously shrinks, when a channel length decreases to a certain value, a FinFET structure may not provide sufficient electrostatic control and sufficient drive current. Accordingly, a nanosheet structure, that is, a gate-all-around (GAA) technology, is introduced. Compared with a FinFET structure, a GAA feature of a nanosheet structure may provide an excellent channel control capability. In addition, due to excellent distribution of channels in three dimensions, effective drive current per unit area may be optimized.

With demand for a smaller track height, further reduction of a cell height may require a smaller spacing between an NMOS device and a PMOS device in a standard cell. However, for a fin field effect transistor and a nanosheet, a spacing between an NMOS device and a PMOS device may be limited by a forming process. To expand scalability of these devices, an innovative architecture, called a fork nanosheet (forksheet) device, is proposed. A forksheet may be considered as a natural extension of a nanosheet. Compared with a nanosheet, a channel of a forksheet may be controlled by a fork gate structure. In a forming process of a forksheet, a dielectric wall may be introduced between an NMOS device and a PMOS device before gate patterning. The dielectric wall may physically isolate and electrically isolate an NMOS gate groove from a PMOS gate groove, and a spacing between the NMOS device and the PMOS device may be reduced. Accordingly, the forksheet may have better scalability of area and performance.

However, performance of a forksheet needs to be further improved. The disclosed structures and methods are directed to solve one or more problems set forth above and other problems in the art.

BRIEF SUMMARY OF THE DISCLOSURE

One aspect of the present disclosure includes a semiconductor structure. The semiconductor structure includes a substrate including a first region and a second region. The semiconductor structure also includes a first isolation structure on the first region, and a first nanostructure and a second nanostructure on two sides of the first isolation structure respectively. The semiconductor structure also includes a second isolation structure on the second region, and a third nanostructure and a fourth nanostructure on two sides of the second isolation structure. A top of the second isolation structure is lower than a top of the first isolation structure. The semiconductor structure also includes a first gate structure and a second gate structure on the first region. The first gate structure is on the first nanostructure, the second gate structure is on the second nanostructure, and the first gate structure and the second gate structure expose a top surface of the first isolation structure. The semiconductor structure also includes a third gate structure and a fourth gate structure on the second region. The third gate structure is on the third nanostructure, the fourth gate structure is on the fourth nanostructure, and the third gate structure and the fourth gate structure are in contact with each other on a top surface of the second isolation structure.

Optionally, the first isolation structure has a height in a range approximately from 10 nanometers to 100 nanometers.

Optionally, the second isolation structure is lower than the first isolation structure, and height difference between the second isolation structure and the first isolation structure is in a range approximately from 0 nanometer to 50 nanometers.

Optionally, the first isolation structure between the first nanostructure and the second nanostructure has a width in a range approximately from 2 nanometers to 50 nanometers, and the second isolation structure between the third nanostructure and the fourth nanostructure has a width in a range approximately from 2 nanometers to 50 nanometers.

Optionally, the semiconductor structure also includes a first isolation layer on the first region. The first isolation layer is on a portion of a sidewall of the first nanostructure and a portion of a sidewall of the second nanostructure, and a top surface of the first isolation layer is lower than a top surface of the first nanostructure and a top surface of the second nanostructure. The semiconductor structure also includes a second isolation layer on the second region. The second isolation layer is on a portion of a sidewall of the third nanostructure and a portion of a sidewall of the fourth nanostructure, and a top surface of the second isolation layer is lower than a top surface of the third nanostructure and a top surface of the fourth nanostructure.

Optionally, the first isolation structure is made of a material including a dielectric material. The dielectric material includes silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof. The second isolation structure is made of a material including a dielectric material. The dielectric material includes silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof.

Optionally, the semiconductor structure also includes a dielectric layer on the substrate. The dielectric layer is on a sidewall of the first gate structure, a sidewall of the second gate structure, a sidewall of the third gate structure, and a sidewall of the fourth gate structure.

Another aspect of the present disclosure includes a method of forming a semiconductor structure. The method includes providing a substrate, the substrate including a first region and a second region, and forming a first isolation structure, and a first nanostructure and a second nanostructure on two sides of the first isolation structure respectively. The method also includes forming a second isolation structure, and a third nanostructure and a fourth nanostructure on two sides of the second isolation structure respectively. A top of the second isolation structure is lower than a top of the first isolation structure. The method also includes forming a first gate structure and a second gate structure on the first region. The first gate structure is on the first nanostructure, the second gate structure is on the second nanostructure, and the first gate structure and the second gate structure expose a top surface of the first isolation structure. The method also includes forming a third gate structure and a fourth gate structure on the second region. The third gate structure is on the third nanostructure, the fourth gate structure is on the fourth nanostructure, and the third gate structure and the fourth gate structure are in contact with each other on a top surface of the second isolation structure.

Optionally, a process of forming the first isolation structure and the second isolation structure includes forming a stacked material structure on the substrate. The stacked material structure includes a stack of a plurality of nanowire material layers and a sacrificial material layer on a nanowire material layer of the plurality of nanowire material layers. The process also includes forming a first opening in the stacked material structure on the first region, and forming a second opening in the stacked material structure on the second region, forming a first isolation structure in the first opening and forming an initial isolation structure in the second opening, and removing a portion of the initial isolation structure on the second region and forming a second isolation structure on the second region.

Optionally, a process of removing the portion of the initial isolation structure on the second region includes forming a first mask layer on the substrate. The first mask layer exposes a surface of the second region. The process also includes using the first mask layer as a mask, etching the initial isolation structure on the second region and forming the second isolation structure.

Optionally, a process of etching the initial isolation structure on the second region includes a dry etching process.

Optionally, a process of forming the first opening and the second opening includes forming a second mask layer on the stacked material structure. The second mask layer exposes a portion of a surface of the sacrificial material layer. The process also includes using the second mask layer as a mask, removing a portion of the stacked material structure until a surface of the substrate is exposed, forming a first opening in the stacked material structure on the first region, and forming an initial first nanostructure and an initial second nanostructure on the first region. The initial first nanostructure includes a plurality of first composite layers, a first composite layer of the plurality of first composite layers includes a first nanowire and a first sacrificial layer on the first nanowire, the initial second nanostructure includes a plurality of second composite layers, and a second composite layer of the plurality of second composite layers includes a second nanowire and a second sacrificial layer on the second nanowire. The process also includes forming a second opening in the stacked material structure on the second region, and forming an initial third nanostructure and an initial fourth nanostructure on the second region. The initial third nanostructure includes a plurality of third composite layers, a third composite layer of the plurality of third composite layers includes a third nanowire and a third sacrificial layer on the third nanowire, the initial fourth nanostructure includes a plurality of fourth composite layers, and a fourth composite layer of the plurality of fourth composite layers includes a fourth nanowire and a fourth sacrificial layer on the fourth nanowire.

Optionally, after forming the first isolation structure and the second isolation structure, and before forming the first gate structure and the second gate structure, the method also includes forming a first dummy gate structure on the first region. The first dummy gate structure spans the initial first nanostructure, the initial second nanostructure, and the first isolation structure. The method also includes forming a second dummy gate structure on the second region. The second dummy gate structure spans the initial third nanostructure, the initial fourth nanostructure, and the second isolation structure. The method also includes forming a dielectric layer on the substrate. The dielectric layer is located on a sidewall of the first dummy gate structure and a sidewall of the second dummy gate structure. The method also includes removing the first dummy gate structure and the second dummy gate structure, and forming a first gate opening in the dielectric layer on the first region. The first gate opening exposes a portion of the sidewall surface of the initial first nanostructure and a portion of the sidewall surface of the initial second nanostructure. The method also includes forming a second gate opening in the dielectric layer on the second region. The second gate opening exposes a portion of a sidewall surface of the initial third nanostructure and a portion of a sidewall surface of the initial fourth nanostructure.

Optionally, a process of forming the first nanostructure, the second nanostructure, the third nanostructure, and the fourth nanostructure includes removing the first sacrificial layer and the second sacrificial layer exposed by the first gate opening, forming a first groove between adjacent first nanowires to form the first nanostructure, and forming a second groove between adjacent second nanowires to form the second nanostructure. The process also includes removing the third sacrificial layer and the fourth sacrificial layer exposed by the second gate opening, forming a third groove between adjacent third nanowires to form the third nanostructure, and forming a fourth groove between adjacent fourth nanowires to form the fourth nanostructure.

Optionally, a process of forming the first gate structure, the second gate structure, the third gate structure, and the fourth gate structure includes forming a first initial gate structure in the first gate opening, in the first groove, and in the second groove. The first initial gate structure spans the first nanostructure, the second nanostructure, and the first isolation structure. The process also includes forming a second initial gate structure in the second gate opening, in the third groove, and in the fourth groove. The second initial gate structure spans the third nanostructure, the fourth nanostructure, and the second isolation structure. The process also includes planarizing the first initial gate structure and the second initial gate structure until the top surface of the first isolation structure is exposed, forming the first gate structure and the second gate structure on the first region, and forming the third gate structure and the fourth gate structure on the second region.

Optionally, before forming the first dummy gate structure and the second dummy gate structure, the method also includes forming a first isolation layer on the first region. The first isolation layer is on a portion of a sidewall of the initial first nanostructure and a portion of a sidewall of the initial second nanostructure, and a top surface of the first isolation layer is lower than a top surface of the initial first nanostructure and a top surface of the initial second nanostructure. The method also includes forming a second isolation layer on the second region. The second isolation layer is on a portion of a sidewall of the initial third nanostructure and a portion of a sidewall of the initial fourth nanostructure, and a top surface of the second isolation layer is lower than a top surface of the initial third nanostructure and a top surface of the initial fourth nanostructure.

Optionally, the first isolation structure has a height in a range approximately from 10 nanometers to 100 nanometers.

Optionally, the second isolation structure is lower than the first isolation structure, and height difference between the second isolation structure and the first isolation structure is in a range approximately from 0 nanometer to 50 nanometers.

Optionally, the first isolation structure between the first nanostructure and the second nanostructure has a width in a range approximately from 2 nanometers to 50 nanometers, and the second isolation structure between the third nanostructure and the fourth nanostructure has a width in a range approximately from 2 nanometers to 50 nanometers.

Optionally, the first isolation structure is made of a material including a dielectric material. The dielectric material includes silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof. The second isolation structure is made of a material including a dielectric material. The dielectric material includes silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof.

As disclosed, the technical solutions of the present disclosure have the following advantages.

The semiconductor structure provided by the present disclosure includes a first isolation structure and a second isolation structure, and a top of the second isolation structure is lower than a top of the first isolation structure. The semiconductor structure also includes a first gate structure and a second gate structure formed on the first region. The first gate structure and the second gate structure may expose a top surface of the first isolation structure, such that the first gate structure and the second gate structure may be isolated from each other. The semiconductor structure also includes a third gate structure and a fourth gate structure formed on the second region. The third gate structure and the fourth gate structure may be in contact with each other on a top surface of the second isolation structure, such that the third gate structure and the fourth gate structure may be electrically connected. Accordingly, different devices may be formed on a same substrate.

In the method of forming a semiconductor structure provided by the present disclosure, a first isolation structure may be formed on a first region, and a second isolation structure may be formed on a second region. A top of the second isolation structure is lower than a top of the first isolation structure. A first gate structure and a second gate structure may be subsequently formed on the first region. The first gate structure and the second gate structure may expose a top surface of the first isolation structure, such that the first gate structure and the second gate structure may be isolated from each other. A third gate structure and a fourth gate structure may be formed on the second region. The third gate structure and the fourth gate structure may be in contact with each other on a top surface of the second isolation structure, such that the third gate structure and the fourth gate structure may be electrically connected. Accordingly, different devices may be formed on a same substrate. The method provided by the present disclosure may simplify a production process. The first gate structure and the second gate structure may be separated. Accordingly, the first gate structure and the second gate structure may not be connected, and performance of the semiconductor structure may not be affected. Accordingly, performance of the semiconductor structure may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

Figure 1:
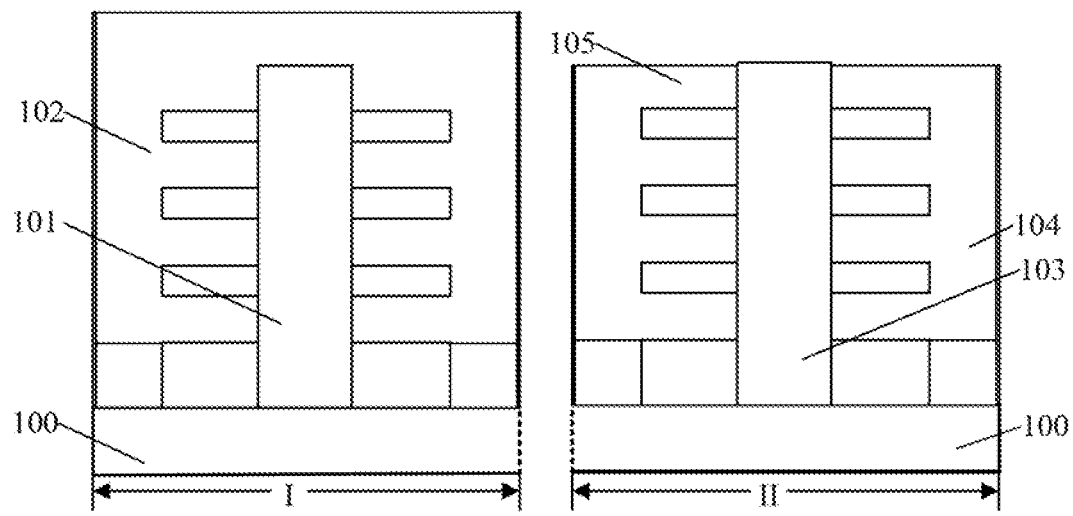
FIG. 1 illustrates a cross-sectional diagram of a semiconductor structure.

Performance of an existing fork nanosheet (forksheet) needs to be improved. FIG. 1 illustrates a cross-sectional diagram of a semiconductor structure. As shown in FIG. 1, the semiconductor structure includes a substrate 100 including a first region I and a second region II, and a first isolation structure 101 on the first region I. The first isolation structure 101 includes a first nanostructure (not labeled) and a second nanostructure (not labeled) on two sides. The semiconductor structure also includes a second isolation structure 103 on the second region II. The second isolation structure 103 includes a third nanostructure (not labeled) and a fourth nanostructure (not labeled) on two sides. The semiconductor structure also includes a first gate structure 102 on the first region I. The first gate structure 102 spans the first isolation structure 101, the first nanostructure, and the second nanostructure. The semiconductor structure also includes a second gate structure 104 and a third gate structure 105 on the second region II. The second gate structure 104 surrounds the third nanostructure, and the third gate structure 105 surrounds the fourth nanostructure. In addition, the second gate structure 104 and the third gate structure 105 expose a top surface of the second isolation structure 103.

In the semiconductor structure shown in FIG. 1, the second gate structure 104 and the third gate structure 105 on the second region II expose the top surface of the second isolation structure 103. In a process of forming the second gate structure 104 and the third gate structure 105, an initial gate structure spanning the third nanostructure, the fourth nanostructure and the second isolation structure 103 is first formed. The initial gate structure and the first gate structure 102 are formed simultaneously, and then a mask layer is formed on a surface of the initial gate structure. The initial gate structure on a top of the second isolation structure 103 is removed by using the mask layer as a mask, and the second gate structure 104 and the third gate structure 105 are formed.

However, when a size of the semiconductor structure is getting smaller and smaller, an accuracy requirement of a photolithography process for forming the mask layer on the surface of the initial gate structure may be difficult to meet. Accordingly, the second gate structure 104 and the third gate structure 105 formed may be connected, and performance of the semiconductor structure may be affected.

To solve problems mentioned above, the present disclosure provides a semiconductor structure and a method for forming the semiconductor structure. The semiconductor structure includes a substrate including a first region and a second region. The semiconductor structure also includes a first isolation structure on the first region, and a first nanostructure and a second nanostructure on two sides of the first isolation structure respectively. The semiconductor structure also includes a second isolation structure on the second region, and a third nanostructure and a fourth nanostructure on two sides of the second isolation structure respectively. A top of the second isolation structure is lower than a top of the first isolation structure. The semiconductor structure also includes a first gate structure and a second gate structure on the first region. The first gate structure and the second gate structure expose a top surface of the first isolation structure. The semiconductor structure also includes a third gate structure and a fourth gate structure on the second region. The third gate structure and the fourth gate structure are in contact with each other on a top surface of the second isolation structure. Formation of the semiconductor structure is improved.

As disclosed, a first isolation structure is formed on the first region, and a second isolation structure is formed on the second region. A top of the second isolation structure is lower than a top of the first isolation structure. A first gate structure and a second gate structure are subsequently formed on the first region. The first gate structure and the second gate structure expose a top surface of the first isolation structure, such that the first gate structure and the second gate structure are isolated from each other. A third gate structure and a fourth gate structure are formed on the second region. The third gate structure and the fourth gate structure are in contact with each other on a top surface of the second isolation structure, such that the third gate structure and the fourth gate structure are electrically connected. Accordingly, different devices may be formed on a same substrate. The method provided by the present disclosure may simplify a production process. The first gate structure and the second gate structure may be separated. Accordingly, the first gate structure and the second gate structure may not be connected, and performance of the semiconductor structure may not be affected. Accordingly, performance of the semiconductor structure may be improved.

Figure 8:
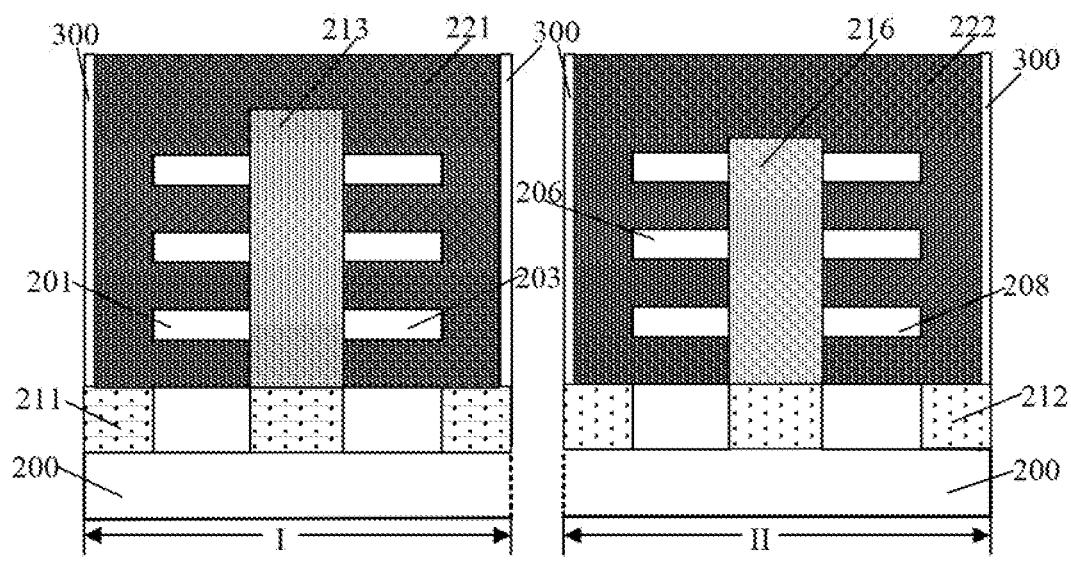
Figure 9:
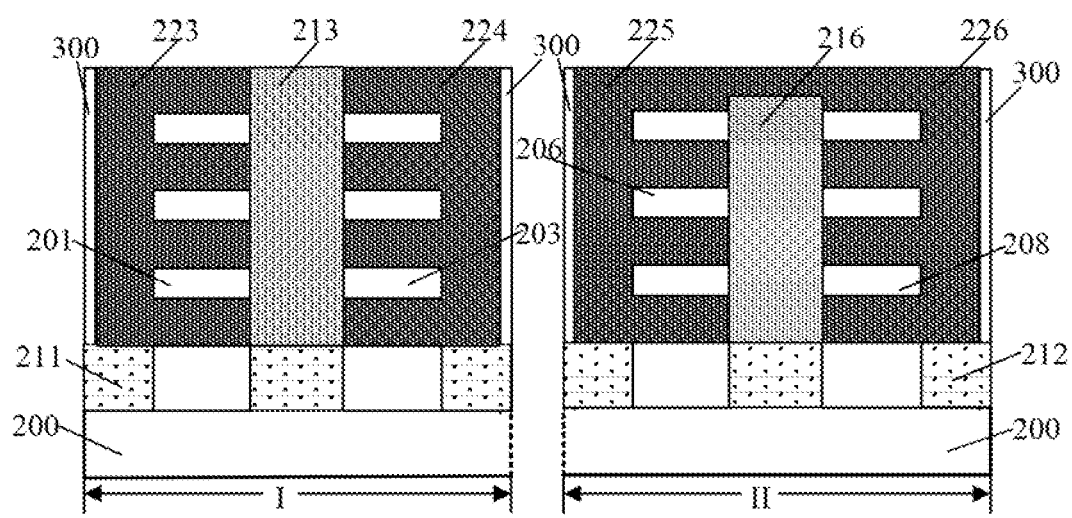
Figure 10:
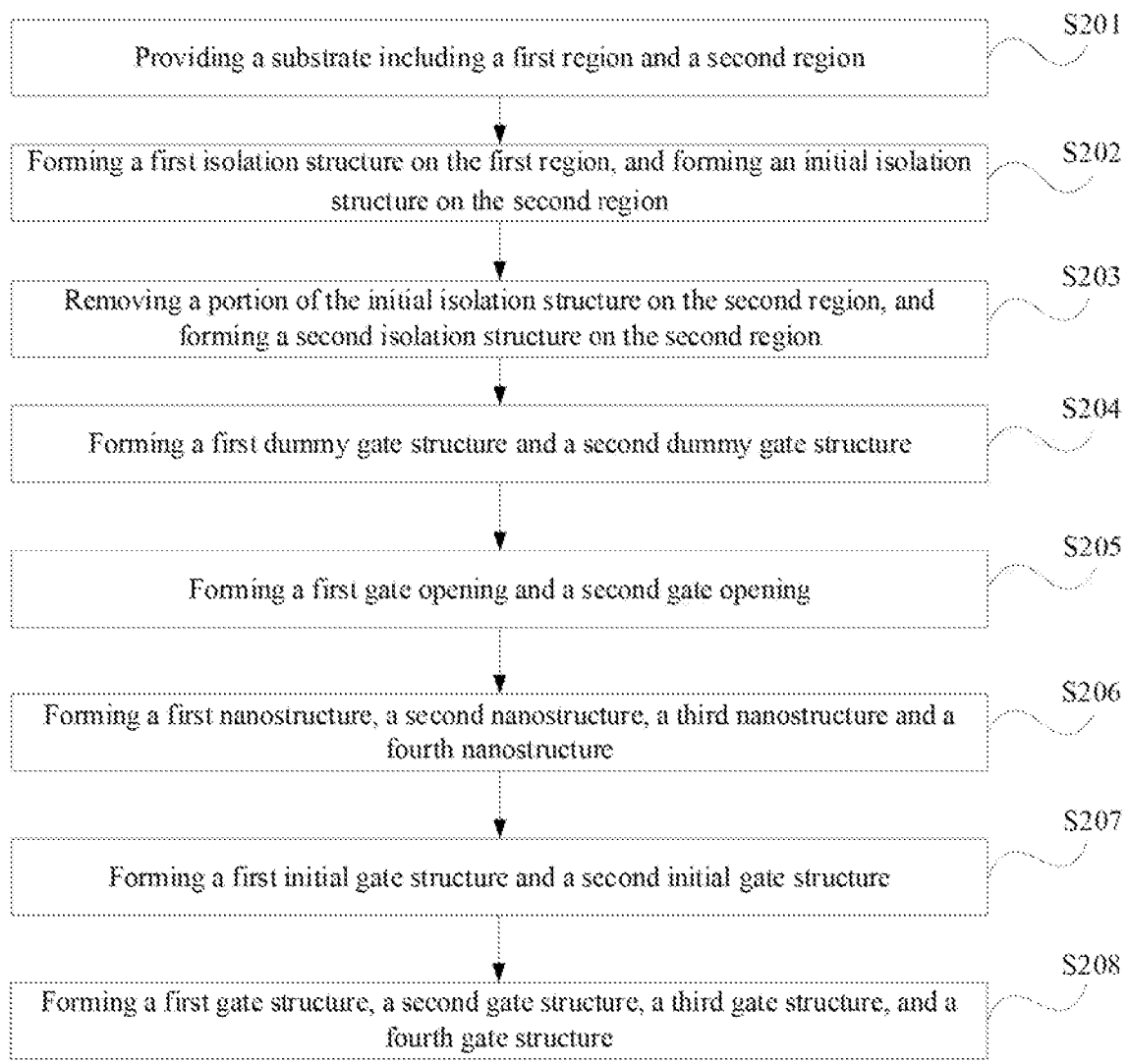
FIG. 10 illustrates a flowchart of an exemplary method of forming a semiconductor structure, consistent with the disclosed embodiments of the present disclosure.

FIG. 10 illustrates a flowchart of an exemplary method of forming a semiconductor structure, consistent with the disclosed embodiments of the present disclosure. FIGS. 2 to 9 illustrate cross-sectional diagrams of semiconductor structures corresponding to certain stages of the exemplary method of forming the semiconductor structure.

Figure 2:
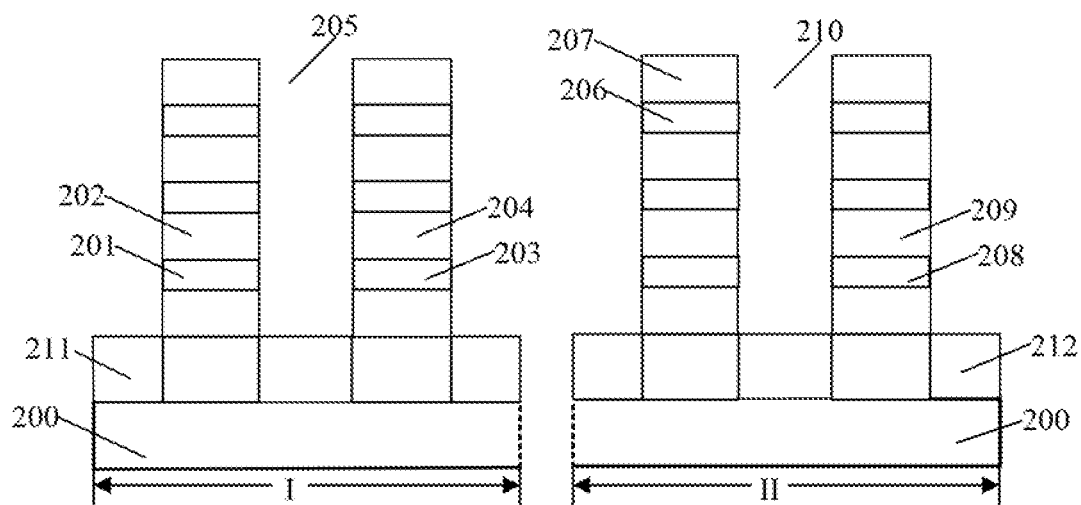
FIGS. 2 to 9 illustrate cross-sectional diagrams of semiconductor structures corresponding to certain stages of an exemplary method of forming a semiconductor structure, consistent with the disclosed embodiments of the present disclosure.

As shown in FIG. 10, at the beginning of the method of forming the semiconductor structure, a substrate is provided (S201). FIG. 2 illustrates a corresponding semiconductor structure. Referring to FIG. 2, a substrate 200 is provided. The substrate 200 includes a first region I and a second region II.

In one embodiment, the substrate 200 is made of a material including silicon. In some other embodiments, the substrate may be made of a material including silicon carbide, silicon germanium, multi-element semiconductor material composed of group III-V elements, silicon-on-insulator (SOI), germanium-on-insulator (GOI), or a combination thereof. The multi-element semiconductor material composed of group III-V elements may include InP, GaAs, GaP, InAs, InSb, InGaAs, InGaAsP, or a combination thereof.

A first isolation structure and a first nanostructure and a second nanostructure on two sides of the first isolation structure are formed on the first region I. The first nanostructure includes a plurality of first nanowires discrete from each other along a direction perpendicular to a surface of the substrate. A first groove is formed between adjacent first nanowires. The second nanostructure includes a plurality of second nanowires discrete from each other along a direction perpendicular to the surface of the substrate. A second groove is formed between adjacent second nanowires.

A second isolation structure, and a third nanostructure and a fourth nanostructure on two sides of the second isolation structure are formed on the second region II. A top of the second isolation structure may be lower than a top of the first isolation structure. The third nanostructure includes a plurality of third nanowires discrete from each other along a direction perpendicular to the surface of the substrate. A third groove is formed between adjacent third nanowires. The fourth nanostructure includes a plurality of fourth nanowires discrete from each other along a direction perpendicular to the surface of the substrate. A fourth groove is formed between adjacent fourth nanowires.

For a process of forming the first isolation structure, the second isolation structure, the first nanostructure, the second nanostructure, the third nanostructure, and the fourth nanostructure, reference may be made to FIGS. 3 to 8.

Still referring to FIG. 2, an initial first nanostructure and an initial second nanostructure are formed on the first region I. A first opening 205 is located between the initial first nanostructure and the initial second nanostructure. An initial third nanostructure and an initial fourth nanostructure are formed on the second region II. A second opening 210 is located between the initial third nanostructure and the initial fourth nanostructure.

The initial first nanostructure includes a plurality of first composite layers. A first composite layer of the plurality of first composite layers includes a first nanowire 201 and a first sacrificial layer 202 on the first nanowire 201. The initial second nanostructure includes a plurality of second composite layers. A second composite layer of the plurality of second composite layers includes a second nanowire 203 and a second sacrificial layer 204 on the second nanowire 203.

The initial third nanostructure includes a plurality of third composite layers. A third composite layer of the plurality of third composite layers includes a third nanowire 206 and a third sacrificial layer 207 on the third nanowire 206. The initial fourth nanostructure includes a plurality of fourth composite layers. A fourth composite layer of the plurality of fourth composite layers includes a fourth nanowire 208 and a fourth sacrificial layer 209 on the fourth nanowire 208.

A process of forming the first opening 205 and the second opening 210 includes forming a stacked material structure (not shown) on the substrate 200. The stacked material structure includes a stack of a plurality of nanowire material layers and sacrificial material layers on the nanowire material layers. The process also includes forming a second mask layer (not shown) on the stacked material structure, the second mask layer exposing a portion of a surface of the sacrificial material layers. The process also includes, using the second mask layer as a mask, removing a portion of the stacked material structure until a surface of the substrate 200 is exposed. A first opening 205 is formed in the stacked material structure on the first region I, and an initial first nanostructure and an initial second nanostructure are formed on the first region I. A second opening 210 is formed in the stacked material structure on the second region II, and an initial third nanostructure and an initial fourth nanostructure are formed on the second region II.

The sacrificial material layer is made of a material including silicon or silicon germanium. The nanowire material layer is made of a material including silicon or silicon germanium. The sacrificial material layer and the nanowire material layer are made of different materials. Accordingly, when the first sacrificial layer 202, the second sacrificial layer 204, the third sacrificial layer 207, and the fourth sacrificial layer 209 are subsequently removed, a removal process may cause little damage to the first nanowire 202, the second nanowire 204, the third nanowire 206, and the fourth nanowire 208. In one embodiment, the sacrificial material layer is made of a material including silicon germanium, and the nanowire material layer is made of a material including silicon.

Still referring to FIG. 2, a first isolation layer 211 is formed on the first region I. The first isolation layer 211 is on a portion of a sidewall of the initial first nanostructure and a portion of a sidewall of the initial second nanostructure. A top surface of the first isolation layer 211 is lower than a top surface of the initial first nanostructure and a top surface of the initial second nanostructure. A second isolation layer 212 is formed on the second region II. The second isolation layer 212 is on a portion of a sidewall of the initial third nanostructure and a portion of a sidewall of the initial fourth nanostructure. A top surface of the second isolation layer 212 is lower than a top surface of the initial third nanostructure and a top surface of the initial fourth nanostructure.

A process of forming the first isolation layer 211 and the second isolation layer 212 includes forming an isolation material layer (not shown) on the substrate 200. The process also includes planarizing the isolation material layer until a top of the initial first nanostructure, a top of the initial second nanostructure, a top of the initial third nanostructure, and a top surface of the initial fourth nanostructure are exposed, and forming an initial isolation structure (not shown). The process also includes etching back the initial isolation structure, and forming the first isolation layer 211 and the second isolation layer 212.

The first isolation layer 211 is made of a material including a dielectric material. The dielectric material may include a material including silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof. The second isolation layer 212 is made of a material including a dielectric material. The dielectric material may include a material including silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof.

In one embodiment, the first isolation layer 211 is made of a material including silicon oxide, and the second isolation layer 212 is made of a material including silicon oxide.

The first isolation layer 211 exposes a sidewall surface of the first sacrificial layer 202 and a sidewall surface of the second sacrificial layer 204. The second isolation layer 212 exposes a sidewall surface of the third sacrificial layer 207 and a sidewall surface of the fourth sacrificial layer 209. Accordingly, when the first sacrificial layer 202, the second sacrificial layer 204, the third sacrificial layer 207, and the fourth sacrificial layer 209 are subsequently removed, the first isolation layer 211 and the second isolation layer 212 may not block the removal process.

Figure 3:
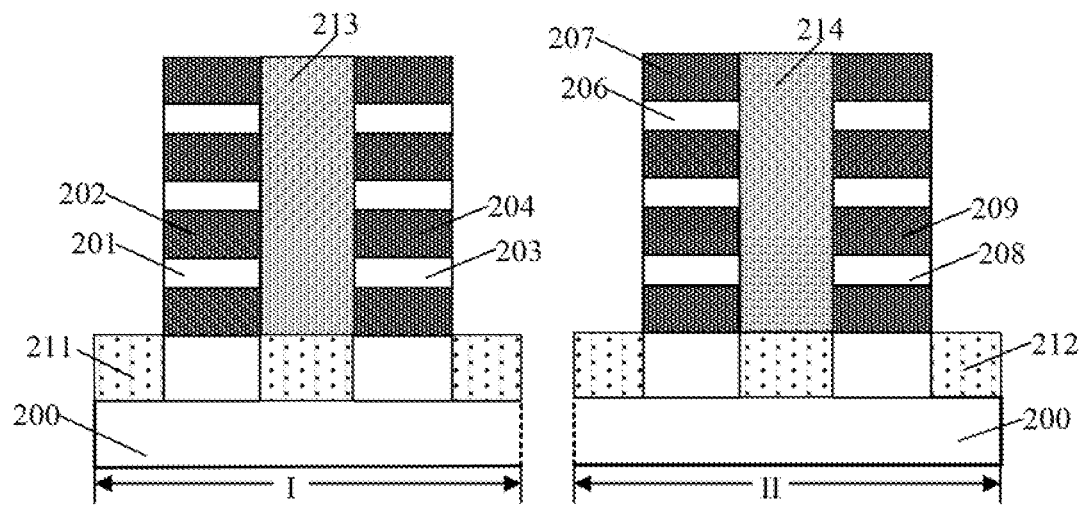

Returning to FIG. 10, after providing the substrate, a first isolation structure may be formed in the first opening, and an initial isolation structure may be formed in the second opening (S202). FIG. 3 illustrates a corresponding semiconductor structure.

Referring to FIG. 3, a first isolation structure 213 is formed in the first opening 205, and an initial isolation structure 214 is formed in the second opening 210. In one embodiment, the first isolation structure 213 and the initial isolation structure 214 are formed simultaneously.

A process of forming the first isolation structure 213 and the initial isolation structure 214 includes forming an isolation material layer (not shown) in the first opening 205, in the second opening 210, on a surface of the initial first nanostructure, on a surface of the initial second nanostructure, on a surface of the initial third nanostructure, and on a surface of the initial fourth nanostructure. The process also includes removing the isolation material layer on the surface of the initial first nanostructure, the surface of the initial second nanostructure, the surface of the initial third nanostructure, and the surface of the initial fourth nanostructure, and forming the first isolation structure 213 and the initial isolation structure 214.

The first isolation structure 213 is made of a material including a dielectric material. The dielectric material may include a material including silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof. The initial isolation structure 214 is made of a material including a dielectric material. The dielectric material may include a material including silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof.

In one embodiment, the first isolation structure 213 is made of a material including silicon nitride, and the initial isolation structure 214 is made of a material including silicon nitride.

A process of forming the isolation material layer includes chemical vapor deposition (CVD), atomic layer deposition (ALD), physical vapor deposition (PVD), and heat treatment process. A process of removing the isolation material layer on the surface of the initial first nanostructure, the surface of the initial second nanostructure, the surface of the initial third nanostructure, and the surface of the initial fourth nanostructure includes a wet etching process or an isotropic dry etching process.

In one embodiment, the process of forming the isolation material layer includes an atomic layer deposition process. The atomic layer deposition process may form an isolation material layer with a dense structure and a thin thickness.

In a direction perpendicular to the surface of the substrate, the first isolation structure 213 has a height in a range approximately from 40 nanometers to 80 nanometers. In one embodiment, the first isolation structure 213 has a height in a range approximately from 40 nanometers to 80 nanometers.

The first isolation structure 213 located between the initial first nanostructure and the initial second nanostructure has a width in a range approximately from 2 nanometers to 50 nanometers.

In one embodiment, the first isolation structure 213 located between the initial first nanostructure and the initial second nanostructure has a width in a range approximately from 5 nanometers to 15 nanometers. With such a width, the first isolation structure 213 may provide electrical isolation between the first nanostructure and the second nanostructure to be formed later. In addition, the first isolation structure 213 may not be too wide, such that the semiconductor structure may not take up too much area.

Figure 4:
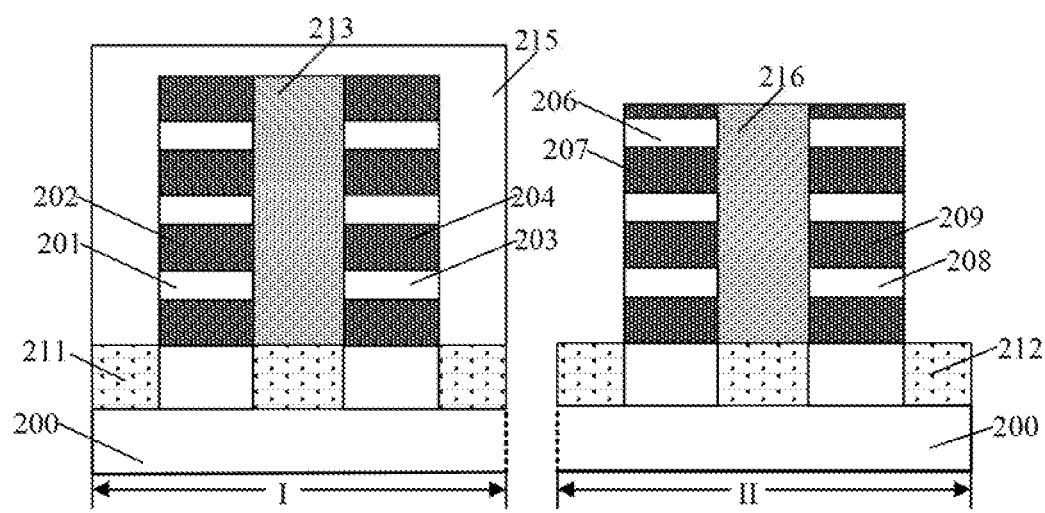

Returning to FIG. 10, after forming the first isolation structure and the initial isolation structure, a portion of the initial isolation structure on the second region may be removed, and a second isolation structure may be formed on the second region (S203). FIG. 4 illustrates a corresponding semiconductor structure.

Referring to FIG. 4, a portion of the initial isolation structure 214 on the second region II is removed, and a second isolation structure 216 is formed on the second region II.

A process of removing a portion of the initial isolation structure 214 on the second region II includes forming a first mask layer 215 on the substrate 200, the first mask layer 215 exposing the surface of the second region II. The process also includes using the first mask layer 215 as a mask, etching the initial isolation structure 214 on the second region II, and forming the second isolation structure 216.

In one embodiment, a process of etching the initial isolation structure 214 on the second region II includes a dry etching process. When etching the initial isolation structure 214, a portion of the initial third nanostructure and a portion of the initial fourth nanostructure are also removed simultaneously.

A height of the second isolation structure 216 is less than a height of the first isolation structure 213. A height difference between the second isolation structure 216 and the first isolation structure 213 may be in a range approximately from 0 nanometer to 50 nanometers. In one embodiment, the height difference between the second isolation structure 216 and the first isolation structure 213 is in a range approximately 5 nanometers to 15 nanometers. In a subsequent process, when the first initial gate structure is planarized to form a first gate structure and a second gate structure, and when the second initial gate structure is planarized to form a third gate structure and a fourth gate structure, the planarization process may stop when the top surface of the first isolation structure 213 is exposed. As such, the first gate structure and the second gate structure that are electrically isolated from each other may be formed, and the third gate structure and the fourth gate structure that are connected on the top of the second isolation structure 216 may be formed.

The second isolation structure 216 located between the initial third nanostructure and the initial fourth nanostructure may have a width in a range approximately from 2 nanometers to 50 nanometers.

In one embodiment, the second isolation structure 216 located between the initial third nanostructure and the initial fourth nanostructure has a width in a range approximately from 5 nanometers to 15 nanometers. With such a width, the second isolation structure 216 may provide electrical isolation between the third nanostructure and the fourth nanostructure to be formed later. In addition, the second isolation structure 216 may not be too wide, such that the semiconductor structure may not take up too much area.

A top of the second isolation structure 216 is lower than a top of the first isolation structure 213. A first gate structure and a second gate structure may be subsequently formed on the first region I. The first gate structure and the second gate structure may expose a top surface of the first isolation structure 213, such that the first gate structure and the second gate structure may be isolated from each other. A third gate structure and a fourth gate structure may be formed on the second region II. The third gate structure and the fourth gate structure may be in contact with each other on a top surface of the second isolation structure 216, such that the third gate structure and the fourth gate structure may be electrically connected. Accordingly, different devices may be formed on a same substrate.

Figure 5:
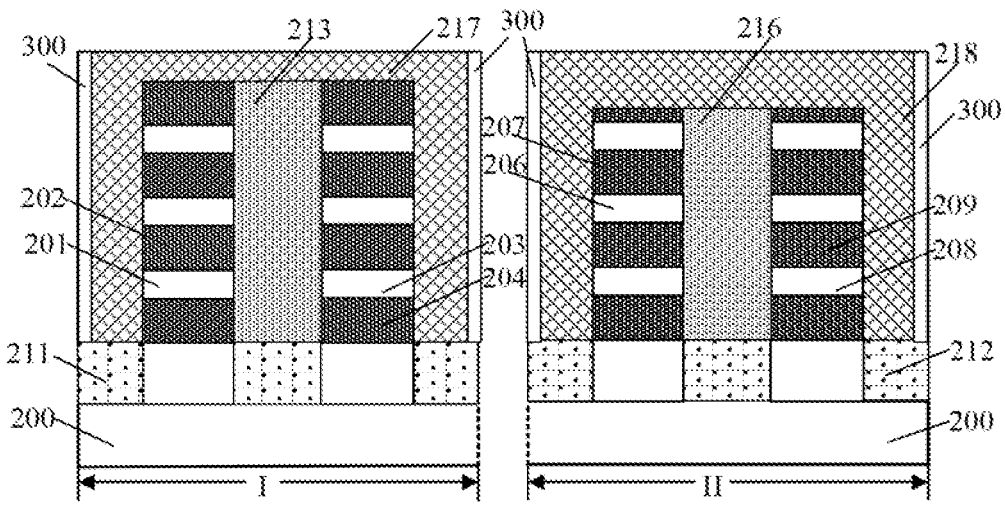

Returning to FIG. 10, after forming the second isolation structure, a first dummy gate structure and a second dummy gate structure may be formed (S204). FIG. 5 illustrates a corresponding semiconductor structure.

Referring to FIG. 5, after forming the first isolation structure 213 and the second isolation structure 216, a first dummy gate structure 217 is formed on the first region I. The first dummy gate structure 217 spans the initial first nanostructure, the initial second nanostructure, and the first isolation structure 213. A second dummy gate structure 218 is formed on the second region II. The second dummy gate structure 218 spans the initial third nanostructure, the initial fourth nanostructure, and the second isolation structure 216.

The first dummy gate structure 217 includes a first dummy gate dielectric layer (not shown) and a first dummy gate electrode layer (not shown) on the first dummy gate dielectric layer. The second dummy gate structure 218 includes a second dummy gate dielectric layer (not shown) and a second dummy gate electrode layer (not shown) on the second dummy gate dielectric layer.

The first dummy gate dielectric layer is made of a material including silicon oxide or a low-K (dielectric constant K less than approximately 3.9) material. The first dummy gate electrode layer is made of a material including silicon. The second dummy gate dielectric layer is made of a material including silicon oxide or a low-K (dielectric constant K less than approximately 3.9) material. The second dummy gate electrode layer is made of a material including silicon.

Still referring to FIG. 5, a dielectric layer 300 is formed on the substrate 200. The dielectric layer 300 is on a sidewall of the first dummy gate structure 217 and a sidewall of the second dummy gate structure 218.

A process of forming the dielectric layer 300 includes forming a dielectric material layer (not shown) on the substrate, and on a top surface and a sidewall surface of the first dummy gate structure 217 and on a top surface and a sidewall surface of the second dummy gate structure 218. The process also includes planarizing the dielectric material layer until a top surface of the first dummy gate structure 217 and a top surface of the second dummy gate structure 218 are exposed to form the dielectric layer 300.

The dielectric layer 300 is made of a material including a dielectric material. The dielectric material includes a material including silicon oxide, silicon nitride, silicon oxynitride, silicon oxycarbide, silicon carbide, nitrogen silicon carbide, nitrogen silicon oxycarbide, or a combination thereof. A process of forming the dielectric material layer includes a chemical vapor deposition process, a heat treatment process, or an atomic layer deposition process.

In one embodiment, the dielectric layer 300 is made of a material including silicon oxide. The process of forming the dielectric material layer includes a chemical vapor deposition process.

Figure 6:
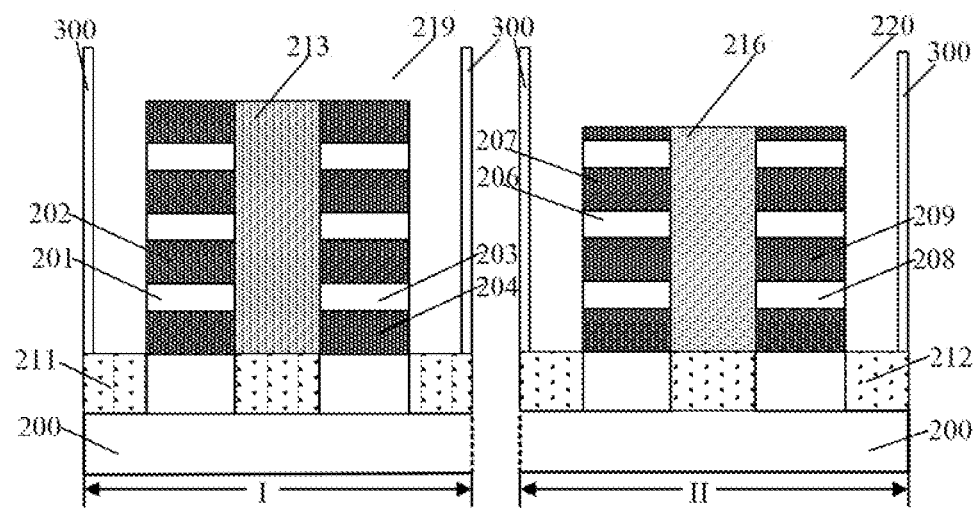

Returning to FIG. 10, after forming the first dummy gate structure and the second dummy gate structure, a first gate opening and a second gate opening may be formed (S205). FIG. 6 illustrates a corresponding semiconductor structure.

Referring to FIG. 6, the first dummy gate structure 217 and the second dummy gate structure 218 are removed. A first gate opening 219 is formed in the dielectric layer 300 on the first region I. The first gate opening 219 exposes a portion of the sidewall surface of the initial first nanostructure and a portion of the sidewall surface of the initial second nanostructure. A second gate opening 220 is formed in the dielectric layer 300 on the second region II. The second gate opening 220 exposes a portion of the sidewall surface of the initial third nanostructure and a portion of the sidewall surface of the initial fourth nanostructure.

A process of removing the first dummy gate structure 217 and the second dummy gate structure 218 includes a dry etching process, a wet etching process, or a combination thereof.

Figure 7:
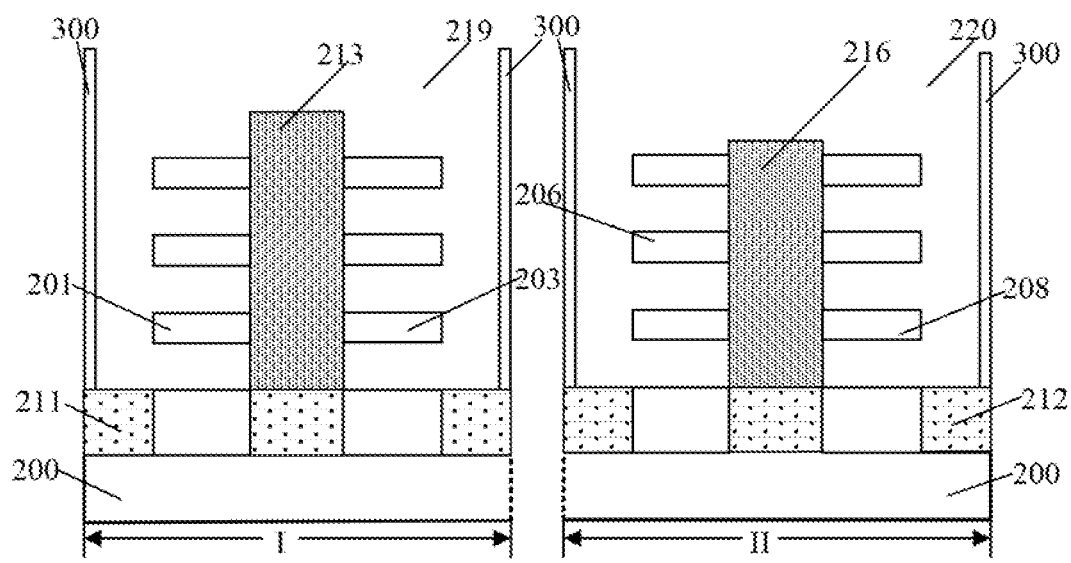

Returning to FIG. 10, after forming the first gate opening and the second gate opening, a first nanostructure, a second nanostructure, a third nanostructure and a fourth nanostructure may be formed (S206). FIG. 7 illustrates a corresponding semiconductor structure.

Referring to FIG. 7, the first sacrificial layer 202 and the second sacrificial layer 204 exposed by the first gate opening 219 are removed. A first groove (not labeled) is formed between adjacent first nanowires 201 to form a first nanostructure, and a second groove (not labeled) is formed between adjacent second nanowires 203 to form a second nanostructure. The third sacrificial layer 207 and the fourth sacrificial layer 209 exposed by the second gate opening are removed. A third groove (not marked) is formed between adjacent third nanowires 206 to form a third nanostructure, and a fourth groove (not marked) is formed between adjacent fourth nanowires 208 to form a fourth nanostructure.

The first nanostructure includes a plurality of first nanowires 201 discrete from each other in a direction perpendicular to the surface of the substrate 200. The second nanostructure includes a plurality of second nanowires 203 discrete from each other in a direction perpendicular to the surface of the substrate 200. The third nanostructure includes a plurality of third nanowires 206 discrete from each other along a direction perpendicular to the surface of the substrate 200. The fourth nanostructure includes a plurality of fourth nanowires 208 discrete from each other in a direction perpendicular to the surface of the substrate 200.

In one embodiment, a process of removing the first sacrificial layer 202, the second sacrificial layer 204, the third sacrificial layer 207, and the fourth sacrificial layer 209 includes a wet etching process. The wet etching process may cause negligible damage to the first nanowire 202, the second nanowire 204, the third nanowire 206, and the fourth nanowire 208.

Next, a first gate structure and a second gate structure are formed on the first region. The first gate structure is on the first nanostructure and in the first groove, and the second gate structure is on the second nanostructure and in the second groove. The first gate structure and the second gate structure expose the top surface of the first isolation structure.

A third gate structure and a fourth gate structure are formed on the second region. The third gate structure is on the third nanostructure and in the third groove, and the fourth gate structure is on the fourth nanostructure and in the fourth groove. The third gate structure and the fourth gate structure are in contact with each other on the top surface of the second isolation structure. For a specific process of forming the first gate structure, the second gate structure, the third gate structure, and the fourth gate structure, reference may be made to FIG. 8 and FIG. 9.

Returning to FIG. 10, after forming the first nanostructure, the second nanostructure, the third nanostructure and the fourth nanostructure, a first initial gate structure and a second initial gate structure may be formed (S207). FIG. 8 illustrates a corresponding semiconductor structure.

Referring to FIG. 8, after removing the first sacrificial layer 202, the second sacrificial layer 204, the third sacrificial layer 207, and the fourth sacrificial layer 209, a first initial gate structure 221 is formed in the first gate opening 219, in the first groove, and in the second groove. The first initial gate structure 221 spans the first nanostructure, the second nanostructure, and the first isolation structure 213. A second initial gate structure 222 is formed in the second gate opening 220, in the third groove, and in the fourth groove. The second initial gate structure 222 spans the third nanostructure, the fourth nanostructure, and the second isolation structure 216.

Returning to FIG. 10, after forming the first initial gate structure and the second initial gate structure, a first gate structure, a second gate structure, a third gate structure, and a fourth gate structure may be formed (S208). FIG. 9 illustrates a corresponding semiconductor structure.

Referring to FIG. 9, the first initial gate structure 221 and the second initial gate structure 222 are planarized until the top surface of the first isolation structure 213 is exposed. A first gate structure 223 and a second gate structure 224 are formed on the first region I. The first gate structure 223 and the second gate structure 224 expose the top surface of the first isolation structure 213. A third gate structure 225 and a fourth gate structure 226 are formed on the second region II. The third gate structure 225 and the fourth gate structure 226 are in contact with each other on the top surface of the second isolation structure 216.

The first gate structure 223 includes a first gate dielectric layer (not shown) and a first gate electrode layer (not shown) on the first gate dielectric layer. The second gate structure 224 includes a second gate dielectric layer (not shown) and a second gate electrode layer (not shown) on the second gate dielectric layer. The third gate structure 225 includes a third gate dielectric layer (not shown) and a third gate electrode layer (not shown) on the third gate dielectric layer. The fourth gate structure 226 includes a fourth gate dielectric layer (not shown) and a fourth gate electrode layer (not shown) on the fourth gate dielectric layer.

In one embodiment, the first gate structure 223 also includes a first work function structure (not shown) located between the first gate dielectric layer and the first gate electrode layer. The second gate structure 224 also includes a second work function structure (not shown) located between the second gate dielectric layer and the second gate electrode layer. The third gate structure 225 also includes a third work function structure (not shown) located between the third gate dielectric layer and the third gate electrode layer. The fourth gate structure 226 also includes a fourth work function structure (not shown) located between the fourth gate dielectric layer and the fourth gate electrode layer. Conductivity types of the first work function structure material and the second work function structure material are opposite. Conductivity types of the third work function structure material and the fourth work function structure material are opposite.

The first gate dielectric layer, the second gate dielectric layer, the third gate dielectric layer, and the fourth gate dielectric layer are each made of a material including a high dielectric constant material. The high dielectric constant material has a dielectric constant greater than approximately 3.9. The high dielectric constant material may include aluminum oxide, hafnium oxide, or a combination thereof. The first gate electrode layer, the second gate electrode layer, the third gate electrode layer and the fourth gate electrode layer are each made of a metal material. The metal material may include tungsten.

The first work function structure is made of a material including an N-type work function material, a P-type work function material, or a combination thereof. The second work function structure is made of a material including an N-type work function material, a P-type work function material, or a combination thereof. The third work function structure is made of a material including an N-type work function material, a P-type work function material, or a combination thereof. The fourth work function structure is made of a material including an N-type work function material, a P-type work function material, or a combination thereof. The N-type work function material may include titanium aluminum, and the P-type work function material may include titanium nitride, tantalum nitride, or a combination thereof.

The first work function structure and the second work function structure may have a complicated material structure. The first work function structure and the second work function structure are generally formed by mixing one or more layers of N-type work function materials and P-type work function materials. In a subsequent process, when a conventional etching process is used to remove the gate structure and the work function structure on the first isolation structure 213, the etching process may be difficult. Precisely etching the first initial gate structure 221 on the top surface of the first isolation structure 213 may be difficult. The first gate structure and the second gate structure formed subsequently may be connected to each other due to unclean etching. Furthermore, when a size of the semiconductor structure is getting smaller and smaller, an accuracy requirement of a photolithography process for forming the mask layer on the surface of the initial gate structure may be difficult to meet.

In one embodiment, a process of planarizing the first initial gate structure 221 and the second initial gate structure 222 includes a chemical mechanical polishing process. By the chemical mechanical polishing process, the first gate structure 223, the second gate structure 224, the third gate structure 225, and the fourth gate structure 226 with good surface flatness may be obtained. In addition, the first initial gate structure 221 on the top surface of the first isolation structure 213 may be removed, such that the first gate structure 223 and the second gate structure 224 may be electrically isolated. Accordingly, the first gate structure 223 and the second gate structure 224 may not be connected, and the performance of the semiconductor structure may thus be improved.

In the method of forming the semiconductor structure provided by the present disclosure, the first gate structure 223 and the second gate structure 224 formed on the first region I expose the top surface of the first isolation structure 213, such that the first gate structure 223 and the second gate structure 224 are isolated from each other. The third gate structure 225 and the fourth gate structure 226 formed on the second region II are in contact with each other on the top surface of the second isolation structure 216, such that the third gate structure 225 and the fourth gate structure 226 are electrically connected. Accordingly, different devices may be formed on a same substrate 200. The method simplifies the production process. The first gate structure 223 and the second gate structure 224 may be separated, such that the first gate structure 223 and the second gate structure 224 may not be electrically connected. As a result, the performance of the semiconductor structure may be improved.

The present disclosure also provides a semiconductor structure. Still referring to FIG. 9, the semiconductor structure includes a substrate 200 including a first region I and a second region II.

The semiconductor structure also includes a first isolation structure 213 on the first region I, and a first nanostructure and a second nanostructure on two sides of the first isolation structure 213 respectively. The first nanostructure includes a plurality of first nanowires 201 discrete from each other along a direction perpendicular to a surface of the substrate 200, and a first groove (not shown) is located between adjacent first nanowires 201. The second nanostructure includes a plurality of second nanowires 203 discrete from each other along a direction perpendicular to the surface of the substrate 200, and a second groove (not shown) is located between adjacent second nanowires 203.

The semiconductor structure also includes a second isolation structure 216 on the second region II. A top of the second isolation structure 216 is lower than a top of the first isolation structure 213. The semiconductor structure also includes a third nanostructure and a fourth nanostructure on two sides of the second isolation structure 216. The third nanostructure includes a plurality of third nanowires 206 discrete from each other along a direction perpendicular to the surface of the substrate 200, and a third groove (not shown) is located between adjacent third nanowires 206. The fourth nanostructure includes a plurality of fourth nanowires 208 discrete from each other along a direction perpendicular to the surface of the substrate 200, and a fourth groove (not shown) is located between adjacent fourth nanowires 208.

The semiconductor structure also includes a first gate structure 223 and a second gate structure 224 on the first region I. The first gate structure 223 is on the first nanostructure and in the first groove. The second gate structure 224 is on the second nanostructure and in the second groove. The first gate structure 223 and the second gate structure 224 expose a top surface of the first isolation structure 213.

The semiconductor structure also includes a third gate structure 225 and a fourth gate structure 226 on the second region II. The third gate structure 225 is on the third nanostructure and in the third groove. The fourth gate structure 226 is on the fourth nanostructure and in the fourth groove. The third gate structure 225 and the fourth gate structure 226 are in contact with each other on a top surface of the second isolation structure 216.

In one embodiment, the first isolation structure 213 has a height in a range approximately from 10 nanometers to 100 nanometers.

In one embodiment, the second isolation structure is lower than the first isolation structure, and height difference between the second isolation structure and the first isolation structure ranges approximately from 0 nanometer to 50 nanometers.

In one embodiment, a width of the first isolation structure 213 located between the first nanostructure and the second nanostructure ranges approximately from 2 nanometers to 50 nanometers. A width of the second isolation structure 216 located between the third nanostructure and the fourth nanostructure ranges approximately from 2 nanometers to 50 nanometers.

In one embodiment, the first gate structure 223 includes a first gate dielectric layer (not shown) and a first gate electrode layer (not shown) on the first gate dielectric layer. The second gate structure 224 includes a second gate dielectric layer (not shown) and a second gate electrode layer (not shown) on the second gate dielectric layer. The third gate structure 225 includes a third gate dielectric layer (not shown) and a third gate electrode layer (not shown) on the third gate dielectric layer. The fourth gate structure 226 includes a fourth gate dielectric layer (not shown) and a fourth gate electrode layer (not shown) on the fourth gate dielectric layer.

In one embodiment, the first gate structure 223 also includes a first work function structure (not shown) located between the first gate dielectric layer and the first gate electrode layer. The second gate structure 224 also includes a second work function structure (not shown) located between the second gate dielectric layer and the second gate electrode layer. The third gate structure 225 also includes a third work function structure (not shown) located between the third gate dielectric layer and the third gate electrode layer. The fourth gate structure 226 also includes a fourth work function structure (not shown) located between the fourth gate dielectric layer and the fourth gate electrode layer. Conductivity types of a first work function structure material and a second work function structure material are opposite. Conductivity types of a third work function structure material and a fourth work function structure material are opposite.

In one embodiment, the semiconductor structure also includes a first isolation layer 211 on the first region I. The first isolation layer 211 is on a portion of a sidewall of the first nanostructure and a portion of a sidewall of the second nanostructure. A top surface of the first isolation layer 211 is lower than a top surface of the first nanostructure and a top surface of the second nanostructure. The semiconductor structure also includes a second isolation layer 212 on the second region II. The second isolation layer 212 is on a portion of a sidewall of the third nanostructure and a portion of a sidewall of the fourth nanostructure. A top surface of the second isolation layer 212 is lower than a top surface of the third nanostructure and a top surface of the fourth nanostructure.

The first isolation structure 213 is made of a material including a dielectric material. The dielectric material may include a material including silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof. The second isolation structure 216 is made of a material including a dielectric material. The dielectric material may include a material including silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof.

In one embodiment, the semiconductor structure also includes a dielectric layer (not shown) on the substrate 200. The dielectric layer is on the sidewalls of the first gate structure 223, the second gate structure 224, the third gate structure 225, and the fourth gate structure 226.

In the semiconductor structure, a top of the second isolation structure 216 is lower than a top of the first isolation structure 213. A first gate structure 223 and a second gate structure 224 may be subsequently formed on the first region I. The first gate structure 223 and the second gate structure 224 may expose a top surface of the first isolation structure 213, such that the first gate structure 223 and the second gate structure 224 may be isolated from each other. A third gate structure 225 and a fourth gate structure 226 may be formed on the second region II. The third gate structure 225 and the fourth gate structure 226 may be in contact with each other on a top surface of the second isolation structure 216, such that the third gate structure 225 and the fourth gate structure 226 may be electrically connected. Accordingly, different devices may be formed on a same substrate.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A semiconductor structure, comprising:
   a substrate including a first region and a second region;
   a first isolation structure on the first region, and a first nanostructure and a second nanostructure on two sides of the first isolation structure respectively;
   a second isolation structure on the second region, and a third nanostructure and a fourth nanostructure on two sides of the second isolation structure respectively, wherein a top of the second isolation structure is lower than a top of the first isolation structure;
   a first gate structure and a second gate structure on the first region, wherein the first gate structure is on the first nanostructure, the second gate structure is on the second nanostructure, and the first gate structure and the second gate structure together expose a top surface of the first isolation structure; and
   a third gate structure and a fourth gate structure on the second region, wherein the third gate structure is on the third nanostructure, the fourth gate structure is on the fourth nanostructure, and the third gate structure and the fourth gate structure are in contact with each other on a top surface of the second isolation structure.

2. The semiconductor structure according to claim 1, wherein:
   the first isolation structure has a height in a range approximately from 10 nanometers to 100 nanometers.

3. The semiconductor structure according to claim 1, wherein:
   the second isolation structure is lower than the first isolation structure; and
   a height difference between the second isolation structure and the first isolation structure is in a range approximately from 0 nanometer to 50 nanometers.

4. The semiconductor structure according to claim 1, wherein:
   the first isolation structure between the first nanostructure and the second nanostructure has a width in a range approximately from 2 nanometers to 50 nanometers; and the second isolation structure between the third nanostructure and the fourth nanostructure has a width in a range approximately from 2 nanometers to 50 nanometers.

5. The semiconductor structure according to claim 1, further comprising:
a first isolation layer on the first region, wherein the first isolation layer is on a portion of a sidewall of the first nanostructure and a portion of a sidewall of the second nanostructure, and a top surface of the first isolation layer is lower than a top surface of the first nanostructure and a top surface of the second nanostructure; and
a second isolation layer on the second region, wherein the second isolation layer is on a portion of a sidewall of the third nanostructure and a portion of a sidewall of the fourth nanostructure, and a top surface of the second isolation layer is lower than a top surface of the third nanostructure and a top surface of the fourth nanostructure.

6. The semiconductor structure according to claim 1, wherein:
the first isolation structure is made of a material including a dielectric material, wherein the dielectric material includes silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof; and
the second isolation structure is made of a material including a dielectric material, wherein the dielectric material includes silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof.

7. The semiconductor structure according to claim 1, further comprising a dielectric layer on the substrate, wherein:
the dielectric layer is on a sidewall of the first gate structure, a sidewall of the second gate structure, a sidewall of the third gate structure, and a sidewall of the fourth gate structure.

8. A method of forming a semiconductor structure, comprising:
providing a substrate, the substrate including a first region and a second region;
forming a first isolation structure on the first region, and a first nanostructure and a second nanostructure on two sides of the first isolation structure respectively;
forming a second isolation structure on the second region, and a third nanostructure and a fourth nanostructure on two sides of the second isolation structure respectively, wherein a top of the second isolation structure is lower than a top of the first isolation structure;
forming a first gate structure and a second gate structure on the first region, wherein the first gate structure is on the first nanostructure, the second gate structure is on the second nanostructure, and the first gate structure and the second gate structure together expose a top surface of the first isolation structure; and
forming a third gate structure and a fourth gate structure on the second region, wherein the third gate structure is on the third nanostructure, the fourth gate structure is on the fourth nanostructure, and the third gate structure and the fourth gate structure are in contact with each other on a top surface of the second isolation structure.

9. The method according to claim 8, wherein a process of forming the first isolation structure and the second isolation structure includes:

forming a stacked material structure on the substrate, wherein the stacked material structure includes a stack of a plurality of nanowire material layers and a sacrificial material layer on a nanowire material layer of the plurality of nanowire material layers;
forming a first opening in the stacked material structure on the first region, and forming a second opening in the stacked material structure on the second region;
forming a first isolation structure in the first opening, and forming an initial isolation structure in the second opening; and
removing a portion of the initial isolation structure on the second region, and forming a second isolation structure on the second region.

10. The method according to claim 9, wherein a process of removing the portion of the initial isolation structure on the second region includes:
forming a first mask layer on the substrate, wherein the first mask layer exposes a surface of the second region; and
using the first mask layer as a mask, etching the initial isolation structure on the second region, thereby forming the second isolation structure.

11. The method according to claim 10, wherein:
a process of etching the initial isolation structure on the second region includes a dry etching process.

12. The method according to claim 9, wherein a process of forming the first opening and the second opening includes:
forming a second mask layer on the stacked material structure, wherein the second mask layer exposes a portion of a surface of the sacrificial material layer;
using the second mask layer as a mask, removing a portion of the stacked material structure until a surface of the substrate is exposed, forming a first opening in the stacked material structure on the first region, and forming an initial first nanostructure and an initial second nanostructure on the first region, wherein the initial first nanostructure includes a plurality of first composite layers, a first composite layer of the plurality of first composite layers includes a first nanowire and a first sacrificial layer on the first nanowire, the initial second nanostructure includes a plurality of second composite layers, and a second composite layer of the plurality of second composite layers includes a second nanowire and a second sacrificial layer on the second nanowire; and
forming a second opening in the stacked material structure on the second region, and forming an initial third nanostructure and an initial fourth nanostructure on the second region, wherein the initial third nanostructure includes a plurality of third composite layers, a third composite layer of the plurality of third composite layers includes a third nanowire and a third sacrificial layer on the third nanowire, the initial fourth nanostructure includes a plurality of fourth composite layers, and a fourth composite layer of the plurality of fourth composite layers includes a fourth nanowire and a fourth sacrificial layer on the fourth nanowire.

13. The method according to claim 12, after forming the first isolation structure and the second isolation structure, and before forming the first gate structure and the second gate structure, further comprising:
forming a first dummy gate structure on the first region, wherein the first dummy gate structure spans the initial first nanostructure, the initial second nanostructure, and the first isolation structure;

forming a second dummy gate structure on the second region, wherein the second dummy gate structure spans the initial third nanostructure, the initial fourth nanostructure, and the second isolation structure;

forming a dielectric layer on the substrate, wherein the dielectric layer is located on a sidewall of the first dummy gate structure and a sidewall of the second dummy gate structure;

removing the first dummy gate structure and the second dummy gate structure, and forming a first gate opening in the dielectric layer on the first region, wherein the first gate opening exposes a portion of the sidewall surface of the initial first nanostructure and a portion of the sidewall surface of the initial second nanostructure; and forming a second gate opening in the dielectric layer on the second region, wherein the second gate opening exposes a portion of a sidewall surface of the initial third nanostructure and a portion of a sidewall surface of the initial fourth nanostructure.

14. The method according to claim 13, wherein a process of forming the first nanostructure, the second nanostructure, the third nanostructure, and the fourth nanostructure includes:

removing the first sacrificial layer and the second sacrificial layer exposed by the first gate opening, forming a first groove between adjacent first nanowires to form the first nanostructure, and forming a second groove between adjacent second nanowires to form the second nanostructure; and removing the third sacrificial layer and the fourth sacrificial layer exposed by the second gate opening, forming a third groove between adjacent third nanowires to form the third nanostructure, and forming a fourth groove between adjacent fourth nanowires to form the fourth nanostructure.

15. The method according to claim 14, wherein a process of forming the first gate structure, the second gate structure, the third gate structure, and the fourth gate structure includes:

forming a first initial gate structure in the first gate opening, in the first groove, and in the second groove, wherein the first initial gate structure spans the first nanostructure, the second nanostructure, and the first isolation structure;

forming a second initial gate structure in the second gate opening, in the third groove, and in the fourth groove, wherein the second initial gate structure spans the third nanostructure, the fourth nanostructure, and the second isolation structure; and planarizing the first initial gate structure and the second initial gate structure until the top surface of the first isolation structure is exposed, forming the first gate structure and the second gate structure on the first region, and forming the third gate structure and the fourth gate structure on the second region.

16. The method according to claim 12, before forming the first dummy gate structure and the second dummy gate structure, further comprising:

forming a first isolation layer on the first region, wherein the first isolation layer is on a portion of a sidewall of the initial first nanostructure and a portion of a sidewall of the initial second nanostructure, and a top surface of the first isolation layer is lower than a top surface of the initial first nanostructure and a top surface of the initial second nanostructure; and forming a second isolation layer on the second region, wherein the second isolation layer is on a portion of a sidewall of the initial third nanostructure and a portion of a sidewall of the initial fourth nanostructure, and a top surface of the second isolation layer is lower than a top surface of the initial third nanostructure and a top surface of the initial fourth nanostructure.

17. The method according to claim 8, wherein:
the first isolation structure has a height in a range approximately from 10 nanometers to 100 nanometers.

18. The method according to claim 8, wherein:
the second isolation structure is lower than the first isolation structure; and
height difference between the second isolation structure and the first isolation structure is in a range approximately from 0 nanometer to 50 nanometers.

19. The method according to claim 8, wherein:
the first isolation structure between the first nanostructure and the second nanostructure has a width in a range approximately from 2 nanometers to 50 nanometers; and
the second isolation structure between the third nanostructure and the fourth nanostructure has a width in a range approximately from 2 nanometers to 50 nanometers.

20. The method according to claim 8, wherein:
the first isolation structure is made of a material including a dielectric material, wherein the dielectric material includes silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof; and
the second isolation structure is made of a material including a dielectric material, wherein the dielectric material includes silicon oxide, silicon nitride, silicon carbide, silicon oxycarbide, silicon oxynitride, aluminum oxide, aluminum nitride, nitrogen silicon carbide, nitrogen silicon oxycarbide, or a combination thereof.

* * * * *